(12) United States Patent
Fuselier et al.

(10) Patent No.: US 6,426,262 B1
(45) Date of Patent: Jul. 30, 2002

(54) METHOD OF ANALYZING THE EFFECTS OF SHADOWING OF ANGLED HALO IMPLANTS

(75) Inventors: Mark Brandon Fuselier, Austin; Jon D. Cheek, Round Rock; Frederick N. Hause; Marilyn I. Wright, both of Austin, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 22 days.

(21) Appl. No.: 09/644,735

(22) Filed: Aug. 23, 2000

(51) Int. Cl.⁷ .......................................... H01L 21/8236
(52) U.S. Cl. ...................... 438/276; 438/286; 438/302
(58) Field of Search .................. 438/302–305, 438/298, 197, 185, 45; 257/444, 346, 348

(56) References Cited

U.S. PATENT DOCUMENTS 5,705,410 A * 1/1998 Guegan
6,083,794 A * 7/2000 Hook et al. .................. 438/286

* cited by examiner

Primary Examiner—David Nelms
Assistant Examiner—Dung A Le
(74) Attorney, Agent, or Firm—Williams, Morgan & Amerson, P.C.

(57) ABSTRACT

The present invention is directed to a method that comprises forming a plurality of transistors, each transistor having at least a gate electrode, and forming halo implant regions in the transistors while varying at least one of a halo implant angle, a masking layer height, and a lateral offset of a masking layer from the gate electrode of the transistors. The method further comprises determining electrical performance characteristics of at least some of the transistors where at least one of the halo implant angle, the masking layer height, and the lateral offset of a masking layer are different, and comparing the determined electrical performance characteristics of the transistors.

24 Claims, 2 Drawing Sheets

METHOD OF ANALYZING THE EFFECTS OF SHADOWING OF ANGLED HALO IMPLANTS

BACKGROUND OF THE INVENTION

1. Field of the Invention

This invention relates generally to semiconductor fabrication technology, and, more particularly, to a method of analyzing the effects of shadowing of halo implants performed on a transistor.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the channel length of a transistor also increases "short-channel" effects. Short-channel effects include, among other things, an increased drain-source leakage current when the transistor is supposed to be switched "off." This is a result of, at least in part, the source/drain depletion regions being closer together because of the shorter channel length. Short-channel effects also include "threshold voltage roll-off" (i.e., the threshold voltage ($V_{th}$) decreases as gate length is reduced), and the like.

In general, short-channel effects may be reduced by using angled halo implants. Angled halo implants are implants of dopants that effectively "reinforce" the doping type of the substrate in the channel between the source/drain extension regions (formerly known as lightly doped drain or LDD regions). For example, for an NMOS transistor, the doping type of the substrate in the channel between the N-type source/drain extension regions is a P-type dopant, e.g., boron (B) or boron difluoride ($BF_2$). In this illustrative example, the halo implant process involves the use of P-type dopants implanted into the substrate at an angle (with respect to a direction horizontal to the surface of the substrate), and with a dose that may range from about $1.0 \times 10^{12}$ to $1.0 \times 10^{14}$ ions/cm$^2$ at an implant energy ranging from about 5–15 keV for boron and about 20–70 keV for boron difluoride.

Similarly, for a PMOS transistor, the doping type of the substrate in the channel between the P-type source/drain extension regions is an N-type dopant, e.g., arsenic or phosphorous. For example, an angled halo implant comprised of arsenic (As) may be implanted into the substrate at an angle (with respect to a direction perpendicular to the surface of the substrate), and with a dose that may range from about $1.0 \times 10^{12}$ to $1.0 \times 10^{14}$ ions/cm$^2$ at an implant energy ranging from about 40–70 keV for arsenic.

As shown in FIG. 1, for example, an illustrative field effect transistor 10 may be formed above a surface 15 of a semiconducting substrate 12, such as doped-silicon. The substrate 12 may be doped with either N-type or P-type dopant materials. The transistor 10 may have a doped-polycrystalline silicon (doped-polysilicon or doped-poly) gate electrode 14 formed above a gate insulation layer 16 that is formed above the surface 15 of the semiconducting substrate 12. The gate electrode 14 and the gate insulation layer 16 may be separated from doped source/drain regions 22 of the transistor 10 by dielectric sidewall spacers 20. The sidewall spacers 20 may be formed above shallow source/drain extension regions 24. Shallow trench isolation regions 18 may be provided to isolate the transistor 10 electrically from neighboring semiconductor devices such as other transistors (not shown).

A typical prior art process flow to produce the structure depicted in FIG. 1 will now be described. Initially, the trench isolations 18 are formed in the substrate 12. Thereafter, the gate insulation layer 16 and the gate electrode 14 are formed by forming the appropriate layers of material above the substrate 12, and thereafter patterning those layers by performing one or more etching processes to define the gate electrode 14 and the gate insulation layer 16. A masking layer 29, comprised of, for example, photoresist, is then formed above the substrate 12 and patterned to define an opening 21, thereby exposing the gate electrode 14 and the gate insulation layer 16. Next, halo implant regions 26 are formed. In particular, a halo implant process 25 is initially performed on one side of the device. Upon completion, the device may be rotated 180° and the halo implant process 25 may then be repeated to form a halo implant region 26 on the opposite side. In practice, the device 10 may be subjected to four halo implants during processing. Four implants are typically performed because many of the transistors formed above a substrate are oriented approximately 90° relative to one another.

Thereafter, a source/drain extension implant process (not shown) is performed to form the source/drain extension regions 24. Note that the implant process is typically self-aligned with respect to the gate electrode, although some small amount of scattering may occur. Thereafter, sidewall spacers 20 are formed adjacent the gate electrode 14. Then, a source/drain implant (not shown) is performed to form the doped region 28. This source/drain implant is generally aligned with respect to the sidewall spacers 20. Lastly, one or more anneal processes are performed to activate the implanted dopant atoms and to repair damage to the lattice structure of the substrate 12. During these anneal processes, the implanted dopant materials migrate, or diffuse, from their implanted location in a more or less isotropic fashion. The post-anneal positions of the various doped regions are depicted approximately in FIG. 1.

As shown in the illustrative NMOS device depicted in FIG. 1, P--doped regions 26 resulting from angled halo implants are typically provided adjacent the N-doped source/drain extension regions 24 to reduce some of the short-channel effects described above. In particular, by "reinforcing" the P-doping type of the semiconducting substrate 12 in the channel between the N-doped source/drain extension regions 24, the laterally non-uniform P--doped angled halo implant regions 26 may improve the threshold roll-off (i.e., the threshold voltage ($V_{th}$) decreasing as gate length is reduced), thereby reducing short-channel induced effects such as a non-zero drain-source leakage current when the transistor is supposed to be switched "off," (i.e., "off-state" leakage).

The angle 27 of the halo dopant implant 25 with respect to a line parallel to the surface 15 of the semiconducting substrate 12 may normally lie within a range of about 30°–60°. Typically, the semiconducting substrate 12 is tilted at the angle 27 with respect to a horizontal direction in an implanter (not shown) and the halo dopant is directed downward in a vertical direction. Alternatively, the semiconducting substrate 12 could be disposed in the horizontal direction in the implanter (not shown) and the halo dopant implant could be directed downward at the angle 27 with respect to the horizontal direction in the implanter, and/or any other combination of tilt and implant direction could be used as long as the angle 27 is the relative angle of the halo implant with respect to a line parallel to the surface 15 of the semiconducting substrate 12.

The halo dopants are implanted into and/or through a region of the substrate 12 that will eventually become the N-doped source/drain extension regions 24 of the device and the N+-doped regions 28. However, the dosage of the halo dopant atoms is typically at least an order of magnitude less than the dosage of dopant for the N-doped source/drain extension regions 24 and the doped regions 28. Similarly, the halo dopant atoms may also be implanted into the doped-poly gate electrode 14 and/or the gate insulation layer 16. However, the doping of the doped-poly gate electrode 14 also typically overwhelms the halo dopant atoms in the gate electrode 14. Furthermore, the amount of the halo dopant atoms in the gate insulation layer 16 is typically miniscule.

Typically, the dopant concentration used during the halo implant process may range from approximately $1.0 \times 10^{12}$ to $1.0 \times 10^{14}$ ions/cm$^2$ of the appropriate dopant atoms, e.g., boron (B) or boron difluoride (BF$_2$) for an illustrative NMOS transistor (the P-type halo implant serving to reinforce the P-type doping of the channel region of the NMOS transistor), or arsenic (As) or phosphorus (P) for an illustrative PMOS transistor (the N-type halo implant serving to reinforce the N-type doping of the channel region of the PMOS transistor). An implant energy of the halo dopant atoms and/or molecules may range from approximately 5–70 keV.

As discussed above, the masking layer 29 comprised of, for example, photoresist, is formed prior to performing the halo implant process 25. The opening 21 formed in the masking layer 29 exposes the transistor 10 to the halo implant process described above. However, as greater numbers of transistors are formed in a given plot space, the packing density of the transistors has increased dramatically. This, in turn, requires that an edge 31 of the opening 21 in the masking layer 29 be positioned increasingly closer to the sidewalls 19 of the gate electrode 14. However, as the masking layer 29 is positioned increasingly closer to the sidewalls 19 of the gate electrode 14, the masking layer 29 may block, or "shadow," the halo implant process 25. Depending upon the degree of this shadowing, device performance may be adversely impacted. For example, the shadowing by the masking layer 29 may be so severe such that essentially none of the angled halo implant process is performed on the device 10. Alternatively, the shadowing may be such that the halo implant dosage is less than would otherwise be desirable. This shadowing may also result from an increased height in the masking layer 29. In any event, altering the effectiveness of angled halo implants by virtue of shadowing during the halo implant process can lead to adverse device performance, such as increased leakage when the transistor is not active, i.e., when the transistor is "off." Additionally, shadowing of the angled halo implants may result in increased device capacitance, thereby slowing device performance.

The present invention is directed to solving, or at least reducing the effects of, some or all of the aforementioned problems.

SUMMARY OF THE INVENTION

The present invention is directed to a method of analyzing the effects of shadowing of angled halo implant processes performed on semiconductor devices. In one illustrative embodiment, the method comprises forming a plurality of transistors, each transistor having at least a gate electrode, and forming halo implant regions in the transistors while varying at least one of a halo implant angle, a masking layer height, and a lateral offset of a masking layer from the gate electrode of the transistors. The method further comprises determining electrical performance characteristics of at least some of the transistors where at least one of the halo implant angle, the masking layer height, and the lateral offset of a masking layer are different, and comparing the determined electrical performance characteristics of the transistors.

BRIEF DESCRIPTION OF THE DRAWINGS

The invention may be understood by reference to the following description taken in conjunction with the accompanying drawings, in which like reference numerals identify like elements, and in which.

Figure 1:
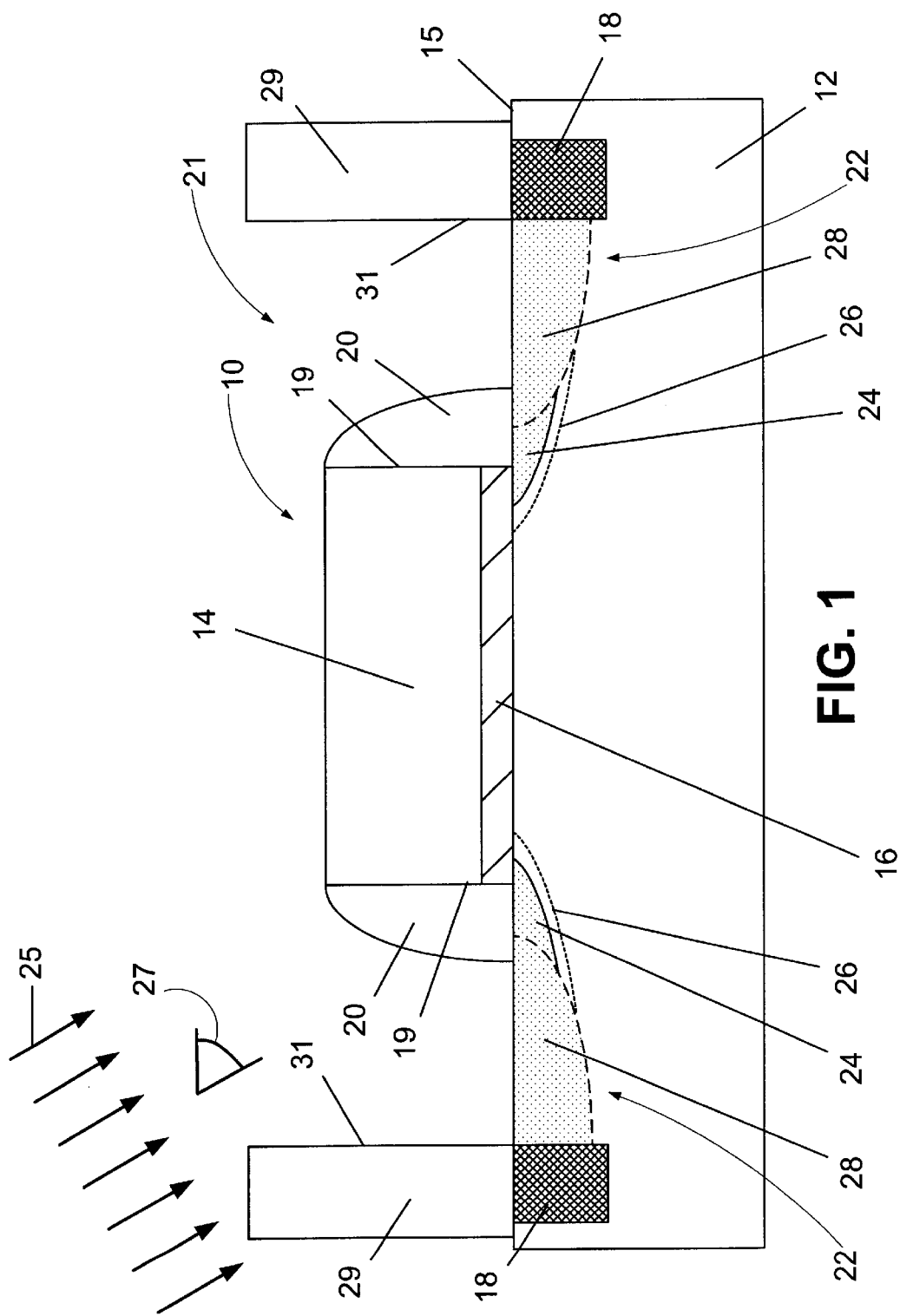
FIG. 1 is a cross-sectional view of an illustrative transistor in which halo implants are formed in the device using an illustrative prior art process flow.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIG. 2. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of analyzing the effects of shadowing of angled implant processes. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2:
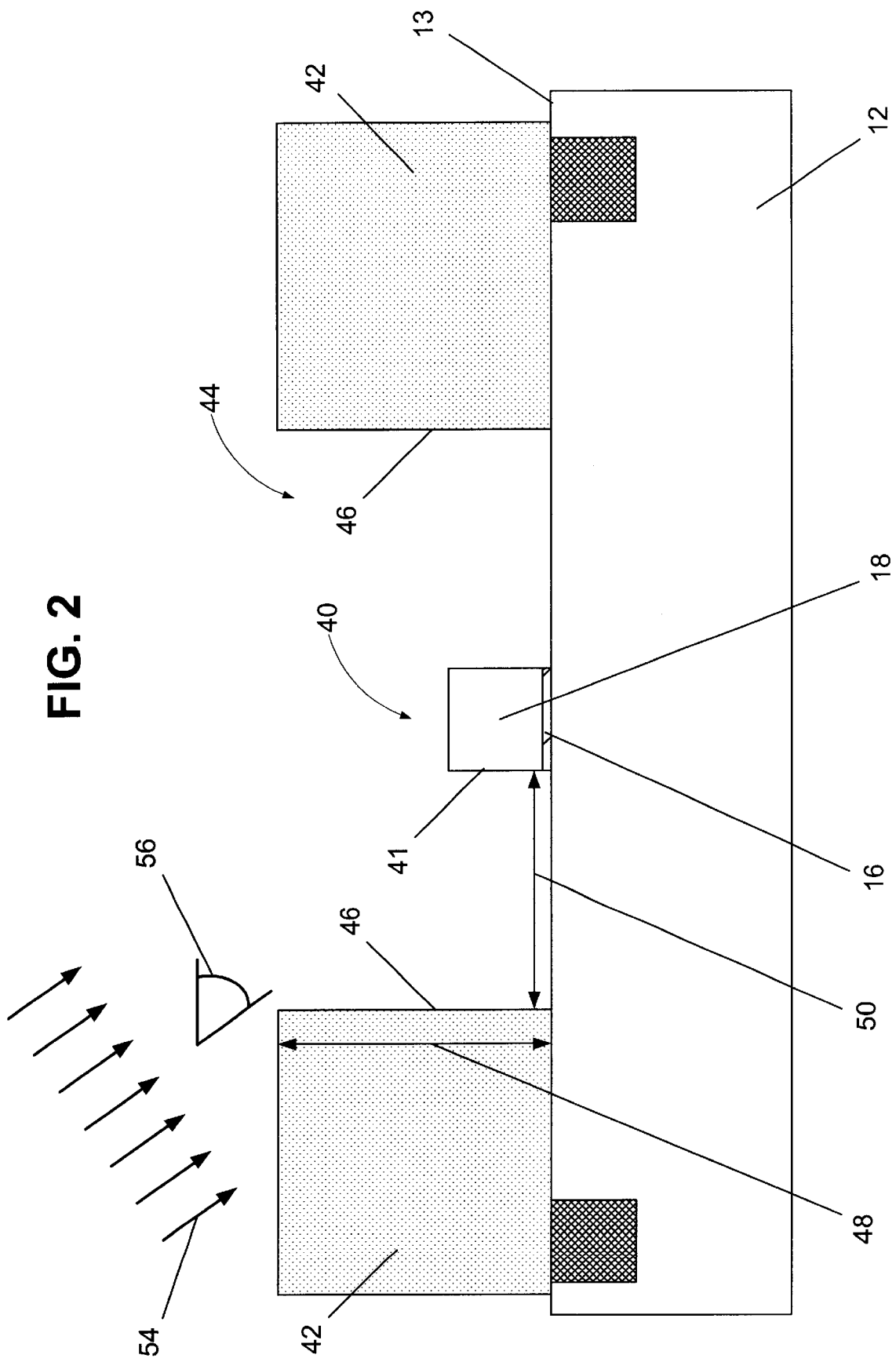
FIG. 2 is a cross-sectional view of an illustrative, partially formed transistor wherein a halo implant process is performed.

FIG. 2 depicts a partially formed semiconductor device 40, e.g., a transistor, comprised of a gate electrode 18 and gate insulation layer 16. In general, the particular materials and techniques used to form the various components or layers of the transistor 40 depicted in FIG. 2, e.g., the gate insulation layer 16 and the gate electrode 18, are matters of design choice, and, thus, should not be considered a limitation of the present invention. For example, the gate insulation layer 16 may be comprised of silicon dioxide, and it may be formed by, for example, a thermal growth process or a deposition process. Similarly, the gate electrode 18 may be comprised of polysilicon, and it may be formed by, for example, a physical vapor deposition ("PVD") or a chemical vapor deposition ("CVD") process. In one illustrative embodiment, the gate electrode 18 is comprised of a layer of polysilicon having a thickness ranging from approximately 1000–4000 Å that is formed by a CVD process.

The substrate 12 may be comprised of a variety of semiconducting materials, such as silicon. The substrate 12 will typically be doped with either an N-type or P-type dopant, depending upon the intended use for the substrate. For example, for NMOS technology, the substrate 12 may be doped with a P-type dopant such as boron or the like. For PMOS technology, the substrate 12 may be doped with an N-type dopant such as arsenic, phosphorous, or the like. It should be noted that the present invention may also be used in CMOS devices in which localized pockets or wells of dopants are formed in the substrate 12 that are of the opposite type to that of the nominal substrate 12. For example, many localized N-type doped regions may be formed in a substrate 12 doped with P-type dopants. Thus, during subsequent processing, a PMOS device may be formed in the area defined by those N-type doped wells, and NMOS devices may be formed in the nominal P-type doped substrate 12.

As an overview, the present invention involves forming halo implant regions in a plurality of transistors while varying at least one of a halo implant angle, a masking layer height, and a lateral offset of a masking layer from the gate electrode of the transistors. Thereafter, an electrical performance characteristic of at least some of the transistors are determined and compared to analyze the impact that variations in the halo implant angle, masking layer height, and masking layer offset have on device performance.

As shown in FIG. 2, the partially formed transistor 40 is formed above the semiconducting substrate 12. The partially formed transistor 40 is comprised of the gate insulation layer 16 and the gate electrode 18. A masking layer 42 is formed above the substrate 12 and patterned to define an opening 44 that exposes the transistor 40 so that halo implant regions (not shown in FIG. 2) may be formed for the transistor 40. The opening 44 in the masking layer 42 is defined by walls 46. The masking layer 42 has a height, indicated by line 48, relative to the surface 13 of the semiconducting substrate 12. Additionally, the walls 46 of the masking layer 42 are laterally offset from the gate conductor 18 of the transistor 40 by an amount indicated by line 50. As indicated in FIG. 2, an angled halo implant process 54 will be performed at an angle 56 to form the halo implant regions (not shown) in the transistor 40.

The masking layer 42, and the opening 44 therein, may be formed so as to vary the height 48 and/or the lateral offset 50 of the masking layer 42. For example, the masking layer 42 may be comprised of a layer of photoresist having a height ranging from approximately 5,000–10,000 Å. Moreover, the lateral offset 50 of the masking layer 42 relative to the gate electrode 18 of the transistor 40 may range from approximately 1500–3000 Å in many modern integrated circuit devices. Additionally, the angle 56 of the halo implant process 54 may be varied as a matter of design choice, typically this angle will vary between approximately 30–60 degrees. Please note that, in the disclosed embodiment, the point of reference for determining the height 48 of the masking layer 42 has been arbitrarily selected as the surface 13 of the substrate 12. Another point of reference could have been equally chosen. Similarly, in the disclosed embodiment, the lateral offset 50 of the masking layer 42 has been described with reference to the sidewalls 41 of the gate electrode 18 of the transistor 40. The center line of the transistor 40 could also serve as an alternative reference point.

As stated previously, the present invention is directed to forming halo implant regions in a plurality of transistors, wherein at least one of the masking layer height 48, the lateral offset 50 of the masking layer 42, and the angle 56 of the halo implant process 54 is varied in order to determine the impact of varying these parameters on device performance. The plurality of transistors under investigation may be formed on single or multiple substrates. For example, in situations where it may be desired to examine the impact of varying the lateral offset 50 of the masking layer 42 from the gate electrode 18, a plurality of transistors may be formed above a single semiconducting substrate, and the lateral offset 50 may be varied for one or more transistors by adjusting the patterning operations used to form the opening 44 in the masking layer 42. That is, the opening 44 may be made progressively larger (or smaller) for a plurality of transistors, thereby increasing (or decreasing) the lateral offset 50. Thereafter, a halo implant process 54 may be performed at a set angle. Given that the height 46 of the masking layer 42 in this situation would be approximately the same for all of the transistors, then the variation in the lateral offset 50 of the masking layer 42 may be analyzed to determine its impact on the location and strength of the halo implant regions formed in the device, and ultimately the impact such variation may have on device performance. Measurement of the lateral offset 50 may be made using a variety of known metrology tools and techniques, e.g., a scanning electron microscope.

Similarly, a plurality of transistors 40 may be formed above one or more semiconducting substrates, wherein the masking layer height 48 and the lateral offset 50 of the masking layer 42 are approximately the same. Thereafter, the angle 56 of the halo implant process 54 may be varied to determine what impact variations in the implant angle have on the location and strength of the halo implant regions in the device, and ultimately on device performance. The angle of the implant process may be readily determined from the ion implantation tool used to perform the halo implant process.

Lastly, the impact of varying the height of the masking layer 42 may also be examined. This may be accomplished by forming a plurality of transistors on multiple semiconducting substrates, and forming masking layers of differing heights on the respective substrates. Thereafter, the masking layers may be patterned such that the lateral offset 50 of the masking layers 42 are approximately the same. Then, angled halo implant processes may be performed at a set angle to analyze the impact of varying the height of the masking layer on implant location and strength, and ultimately on device performance. The height of the masking layer may be readily determined using known metrology tools such as an ellipsometer.

Moreover, the present invention may be used to determine what combinations of two or more of these parameters, e.g., halo implant angle, masking layer height and masking layer offset, are optimal for particular device performance characteristics. That is, a database may be developed correlating combinations of two or more of these parameters to a particular device performance that is deemed optimal by the designer of the device. For example, based upon the results of analyzing each of the individual parameters, as described above, an optimal value for each parameter may be determined. Thereafter, the design rules for fabricating future semiconductor devices may be set such that the optimal values for the angle of the halo implant process, the masking layer height, and the masking layer offset are used.

The present invention is directed to determining a variety of electrical performance characteristics for at least some of the transistors wherein some of the parameters for the halo implant process, e.g., the halo implant angle, the masking layer height, and the masking layer offset, are different. Such electrical performance characteristics include, among other things, off-state leakage current, threshold voltage, on-state current, etc. By analyzing this data, appropriate design rules may be set for the fabrication of future transistors. For example, based upon the information obtained through use of the present invention, a design rule may be established regarding a minimum acceptable value (or range of values) for the lateral offset 50 of the masking layer 42. Similar minimum, maximum or range-type design rules may be established for the angle 56 of the halo implant process 54, and the height 48 of the masking layer 42. The precise values for these parameters will vary depending upon the device under construction and its particular performance requirements. Thus, through use of the present invention, device performance may ultimately be enhanced by setting design rules such that the parameters of halo implant processes that may ultimately impact the location and strength of the halo implant regions are optimized, thereby optimizing device performance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a plurality of transistors, each transistor having at least a gate electrode;
   forming halo implant regions in said transistors while varying at least one of a halo implant angle, a masking layer height, and a lateral offset of a masking layer from said gate electrode of said transistors;
   determining electrical performance characteristics of at least some of said transistors where at least one of said halo implant angle, said masking layer height, and said lateral offset of a masking layer are different; and
   comparing said determined electrical performance characteristics of said at least some of said transistors.

2. The method of claim 1, wherein forming a plurality of transistors, each transistor having at least a gate electrode, comprises forming a plurality of transistors above a single semiconducting substrate, each transistor having at least a gate electrode.

3. The method of claim 1, wherein forming a plurality of transistors, each transistor having at least a gate electrode, comprises forming a plurality of transistors above a plurality of semiconducting substrates, each transistor having at least a gate electrode.

4. The method of claim 1, wherein determining electrical performance characteristics of at least some of said transistors where at least one of said halo implant angle, said masking layer height, and said lateral offset of a masking layer are different comprises determining at least one of an off-state leakage current, threshold voltage, and on-state current of at least some of said transistors where at least one of said halo implant angle, said masking layer height, and said lateral offset of a masking layer are different.

5. The method of claim 1, further comprising determining at least one design rule for manufacturing a transistor based upon said compared electrical performance characteristics of said at least some transistors.

6. The method of claim 5, wherein determining at least one design rule for manufacturing a transistor based upon said compared electrical performance characteristics of said at least some transistors comprises determining at least one of a halo implant angle, a masking layer height, a lateral spacing of a masking layer from a gate electrode of said transistor, and a spacing between adjacent transistors.

7. A method, comprising:
   forming a plurality of transistors, each transistor having at least a gate electrode;
   forming halo implant regions in said transistors while varying a halo implant angle used to form said halo implant regions;
   determining electrical performance characteristics of at least some of said transistors where said halo implant angles used to form said halo implant regions are different; and
   comparing said determined electrical performance characteristics of said at least some of said transistors.

8. The method of claim 7, wherein forming a plurality of transistors, each transistor having at least a gate electrode, comprises forming a plurality of transistors above a single semiconducting substrate, each transistor having at least a gate electrode.

9. The method of claim 7, wherein forming a plurality of transistors, each transistor having at least a gate electrode, comprises forming a plurality of transistors above a plurality of semiconducting substrates, each transistor having at least a gate electrode.

10. The method of claim 7, wherein determining electrical performance characteristics of at least some of said transistors where said halo implant angles used to form said halo implant regions are different comprises determining at least one of an off-state leakage current, threshold voltage, and on-state current of at least some of said transistors where said halo implant angles used to form said halo implant regions are different.

11. The method of claim 7, further comprising determining at least one design rule for manufacturing a transistor based upon said compared electrical performance characteristics of said at least some transistors.

12. The method of claim 11, wherein determining at least one design rule for manufacturing a transistor based upon said compared electrical performance characteristics of said at least some transistors comprises determining at least one of a halo implant angle, a masking layer height, a lateral spacing of a masking layer from a gate electrode of said transistor, and a spacing between adjacent transistors.

13. A method, comprising:

forming a plurality of transistors, each transistor having at least a gate electrode;

forming halo implant regions in said transistors while using masking layers of differing heights;

determining electrical performance characteristics of at least some of said transistors where said masking layer heights used in forming said halo implant regions are different; and comparing said determined electrical performance characteristics of said at least some of said transistors.

14. The method of claim 13, wherein forming a plurality of transistors, each transistor having at least a gate electrode, comprises forming a plurality of transistors above a single semiconducting substrate, each transistor having at least a gate electrode.

15. The method of claim 13, wherein forming a plurality of transistors, each transistor having at least a gate electrode, comprises forming a plurality of transistors above a plurality of semiconducting substrates, each transistor having at least a gate electrode.

16. The method of claim 13, wherein determining electrical performance characteristics of at least some of said transistors where said masking layer heights used in forming said halo implant regions are different comprises determining at least one of an off-state leakage current, threshold voltage, and on-state current of at least some of said transistors where said masking layer heights used to form said halo implant regions are different.

17. The method of claim 13, further comprising determining at least one design rule for manufacturing a transistor based upon said compared electrical performance characteristics of said at least some transistors.

18. The method of claim 17, wherein determining at least one design rule for manufacturing a transistor based upon said compared electrical performance characteristics of said at least some transistors comprises determining at least one of a halo implant angle, a masking layer height, a lateral spacing of a masking layer from a gate electrode of said transistor, and a spacing between adjacent transistors.

19. A method, comprising:

forming a plurality of transistors, each transistor having at least a gate electrode;

forming halo implant regions in said transistors while varying a lateral offset of a masking layer from said gate electrode of said transistors;

determining electrical performance characteristics of at least some of said transistors where said lateral offsets used in forming said halo implant regions are different; and comparing said determined electrical performance characteristics of said at least some of said transistors.

20. The method of claim 19, wherein forming a plurality of transistors, each transistor having at least a gate electrode, comprises forming a plurality of transistors above a single semiconducting substrate, each transistor having at least a gate electrode.

21. The method of claim 19, wherein forming a plurality of transistors, each transistor having at least a gate electrode, comprises forming a plurality of transistors above a plurality of semiconducting substrates, each transistor having at least a gate electrode.

22. The method of claim 19, wherein determining electrical performance characteristics of at least some of said transistors where said lateral offsets used in forming said halo implant regions are different comprises determining at least one of an off-state leakage current, threshold voltage, and on-state current of at least some of said transistors where said lateral offsets used in forming said halo implant regions are different.

23. The method of claim 19, further comprising determining at least one design rule for manufacturing a transistor based upon said compared electrical performance characteristics of said at least some transistors.

24. The method of claim 23, wherein determining at least one design rule for manufacturing a transistor based upon said compared electrical performance characteristics of said at least some transistors comprises determining at least one of a halo implant angle, a masking layer height, a lateral spacing of a masking layer from a gate electrode of said transistor, and a spacing between adjacent transistors.

* * * * *